(12) United States Patent
Kim et al.

(10) Patent No.: US 11,533,022 B2
(45) Date of Patent: Dec. 20, 2022

(54) POWER AMPLIFICATION APPARATUS

(71) Applicant: AGENCY FOR DEFENSE DEVELOPMENT, Daejeon (KR)

(72) Inventors: Taehoon Kim, Daejeon (KR); Jaedon Park, Daejeon (KR); Jungho Joe, Daejeon (KR); Youngsin Kim, Daejeon (KR); Jongsung Park, Daejeon (KR); Inwoong Kang, Daejeon (KR); Sanggeun Jeon, Daejeon (KR); Seungwon Park, Daejeon (KR)

(73) Assignee: Agency for Defense Development, Daejeon (KR)

( * ) Notice: Subject to any disclaimer, the term of this patent is extended or adjusted under 35 U.S.C. 154(b) by 203 days.

(21) Appl. No.: 17/105,985

(22) Filed: Nov. 27, 2020

(65) Prior Publication Data
US 2021/0167736 A1  Jun. 3, 2021

(30) Foreign Application Priority Data
Nov. 28, 2019  (KR) .......................... 10-2019-0155677

(51) Int. Cl.
*H03F 9/00* (2006.01)
*H03F 1/02* (2006.01)
*H03F 3/21* (2006.01)

(52) U.S. Cl.
CPC ............. *H03F 1/0288* (2013.01); *H03F 3/21* (2013.01); *H03F 2200/451* (2013.01)

(58) Field of Classification Search
CPC ................. H03F 9/00; H03F 3/45; H03F 1/12
USPC .................................... 330/165, 276, 51, 252
See application file for complete search history.

(56) References Cited

U.S. PATENT DOCUMENTS

| | | | |
|---|---|---|---|
| 9,991,855 B2 * | 6/2018 | Mizokami | ........... H03F 3/45188 |
| 10,958,323 B1 * | 3/2021 | Ben-Yishay | ......... H04B 7/0608 |
| 2017/0149393 A1 * | 5/2017 | Mizokami | ............... H03F 3/211 |

* cited by examiner

*Primary Examiner* — Henry Choe
(74) *Attorney, Agent, or Firm* — Knobbe, Martens, Olson & Bear, LLP

(57) ABSTRACT

In accordance with an aspect of the present disclosure, there is provided a power amplification apparatus, the apparatus comprising: an input part; a first-1 transformer and a first-2 transformer connected to the input part in parallel; a first amplifier and a second amplifier connected to the first-1 transformer and the first-2 transformer, respectively; a first switch connected to one side of the first-2 transformer; a second-1 transformer and a second-2 transformer connected to the first amplifier and the second amplifier, respectively, and connected to an output part in parallel; and a second switch connected to one side of the second-2 transformer.

6 Claims, 7 Drawing Sheets

POWER AMPLIFICATION APPARATUS

CROSS-REFERENCE TO RELATED APPLICATION

This application claims priority to Korean Patent Application No. 10-2019-0155677, filed on Nov. 28, 2019. The entire contents of the application on which the priority is based are incorporated herein by reference.

TECHNICAL FIELD

The present disclosure relates to a power amplification apparatus for which multiple output is available.

BACKGROUND

A power amplifier is a circuit for determining an output power performance of a transmitter, and one of circuit blocks which exert great influence on a communication distance and an accuracy of the entire transmission and reception system. One of important indices of the power amplifier is an output power, but in considering properties of the power amplifier that consumes a great DC power, an efficiency performance calculated as an output power in comparison with a consumption power is also an important performance of the power amplifier.

The disclosure of this section is to provide background information relating to the invention. Applicant does not admit that any information contained in this section constitutes prior art.

SUMMARY

The present disclosure provides a power amplification apparatus for preventing inefficiency in designing a power amplifier of dual output mode and performance degradation by a switch.

In accordance with an aspect of the present disclosure, there is provided a power amplification apparatus, the apparatus comprising: an input part; a first-1 transformer and a first-2 transformer connected to the input part in parallel; a first amplifier and a second amplifier connected to the first-1 transformer and the first-2 transformer, respectively; a first switch connected to one side of the first-2 transformer; a second-1 transformer and a second-2 transformer connected to the first amplifier and the second amplifier, respectively, and connected to an output part in parallel; and a second switch connected to one side of the second-2 transformer.

Herein, the first switch and the second switch are closed or opened simultaneously.

When the first switch and the second switch are closed, wherein an input signal is transferred to the first amplifier and the second amplifier and amplified.

When the first switch and the second switch are open, an input signal is transferred to the first amplifier and amplified.

Herein the first switch and the second switch include a transistor or a diode.

Herein the first switch includes an inductor and a MOSFET transistor to which a control voltage is applied.

In accordance with another aspect of the present disclosure, there is provided a power amplification apparatus, the apparatus comprising: an input part; a first-1 transformer to a first-n transformer connected to the input part in parallel; a first amplifier to a nth amplifier connected to the first-1 transformer to the first-n transformer, respectively; a first-1 switch to a first-(n−1) switch connected to one side of the first-1 transformer to the first-n transformer; a second-1 transformer to a second-n transformer connected to the first amplifier to the nth amplifier, respectively, and connected to an output part in parallel; and a second-1 switch to a second-(n−1) switch connected to one side of the second-1 transformer to the second-n transformer.

In accordance with still another aspect of the present disclosure, there is provided a power amplification apparatus, the apparatus comprising: an input part; a first amplifier and a second amplifier connected to the input part in parallel; a first switch connected to an input of the second amplifier; and a second switch connected to an output of the second amplifier, wherein the first amplifier includes a first-1 transformer, a first-1 transistor and a first-2 transistor connected to the first-1 transformer in parallel, a first-3 transformer commonly connected to the first-1 transistor and the first-2 transistor, a first-3 transistor and a first-4 transistor connected to an output of the first-3 transformer in parallel and a first-2 transformer commonly connected to the first-3 transistor and the first-4 transistor.

Herein the second amplifier includes a second-1 transformer, a second-1 transistor and a second-2 transistor connected to the second-1 transformer in parallel, a second-3 transformer commonly connected to the second-1 transistor and the second-2 transistor, a second-3 transistor and a second-4 transistor connected to an output of the second-3 transformer in parallel and a second-2 transformer commonly connected to the second-3 transistor and the second-4 transistor.

Herein the first switch includes a transmission line operating as an inductor and a MOSFET transistor to which a control voltage is applied.

The embodiment of the present disclosure designs a power amplifier for which multiple output mode is available, and there is an effect of having high efficiency.

In addition, a distance between a transmitter and a receiver is changed in real time for a mobile communication, and the embodiment of the present disclosure has an effect of reducing DC power consumption by using a high power mode in a long distance and a low power mode in a short distance.

In addition, the embodiment of the present disclosure designs to switch an output mode depending on a modulation scheme and minimizes DC power consumption.

In addition, the embodiment of the present disclosure designs a power amplifier using one type of power amplifier, and there is an effect that a circuit area may be reduced efficiently.

In addition, the embodiment of the present disclosure uses an inductor and a transistor as a switch, and there is an effect that switching loss is reduced.

In addition, the embodiment of the present disclosure designs uses a lossless switch, and there is an effect that the number of power amplifier may be increased without restriction.

DETAILED DESCRIPTION

Figure 1:
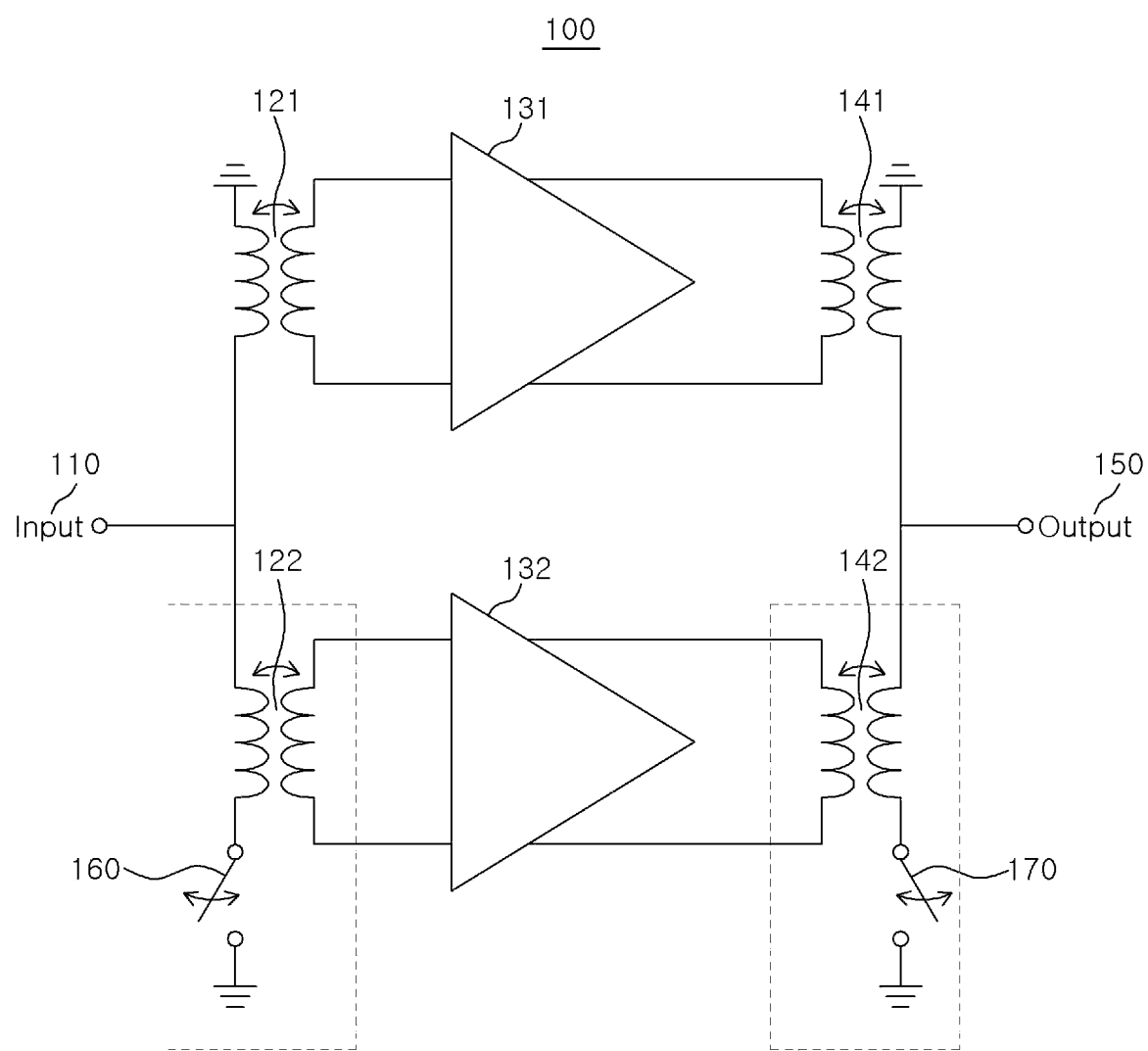
FIG. 1 is a circuit diagram illustrating a power amplification apparatus according to a first embodiment.

The advantages and features of the present disclosure and the methods of accomplishing these will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

In describing the embodiments of the present disclosure, if it is determined that detailed description of related known components or functions unnecessarily obscures the gist of the present disclosure, the detailed description thereof will be omitted. Further, the terminologies to be described below are defined in consideration of functions of the embodiments of the present disclosure and may vary depending on a user's or an operator's intention or practice. Accordingly, the definition thereof may be made on a basis of the content throughout the specification.

Generally, a power amplifier has very low efficiency performance in a low power part but has the property that as an output power increases, the efficiency is also increased together. Accordingly, in order to use a power amplifier with maintaining high efficiency performance, a high power state needs to be maintained continuously.

However, in a mobile communication situation in which a communication distance changes in real time and in the case that a back-off power required by using a modulation scheme of low step is very low, a communication is available only with low power. However, as described above, in a low power period, an efficiency of a power amplifier is very low, and the use is avoided, but the power amplifier is used in a high power period.

In the case that a power amplifier is used in a high power mode, the power amplifier is operated in high efficiency, but it does not mean that the power amplifier consumes low DC power in all cases. Generally, as an output power of a power amplifier increases, a DC power consumption is also increased together with the efficiency. In the case that the power amplifier is operated in a high power mode unnecessarily, the power amplifier generates unnecessary DC power consumption, which significantly reduces a use time of a mobile communication system for which a battery capacity is limited.

As such, in order to reduce unnecessary DC power consumption, a power amplifier for which multiple output powers are available is required, which is available to operate in high efficiency in both of high power and low power situations.

An example power amplifier of dual output mode includes a high power amplifier (HPA) and a low power amplifier (LPA) connected in parallel, an input switch (SWin) and an output switch (SWout) connected to input/output of the power amplifier.

In the example power amplifier, a great time is consumed for design and manufacturing since high power amplifier and the low power amplifier need to be individually designed.

Furthermore, in the example power amplifier, since the input switch is connected to each power amplifier in serial, a switching loss is occurred, and accordingly, gain and output power of the power amplifier are decreased.

In addition, in the case that the example power amplifier operates in a high power mode, very large power is transferred to an output switch. In this case, in the case that the output switch does not have a high linear performance to support the output power of the high power amplifier, the output switch reduces an output power, and further, changes an amplitude of a modulated signal, and demodulation at a receiving end becomes impossible.

Furthermore, the example power amplifier has high loss in comparison with a switch having a single input and a single output, and the design difficulty is also increased. The power amplifier having the structure requires high performance than expected, and the overall design difficulty is increased.

In addition, since the example power amplifier is designed in low frequency band, on-resistance and parasitic capacitance component of a transistor exerts great influence on a switch performance in high frequency band, which causes a performance degradation of overall power amplifier, particularly in designing multiple switch.

Figure 2:
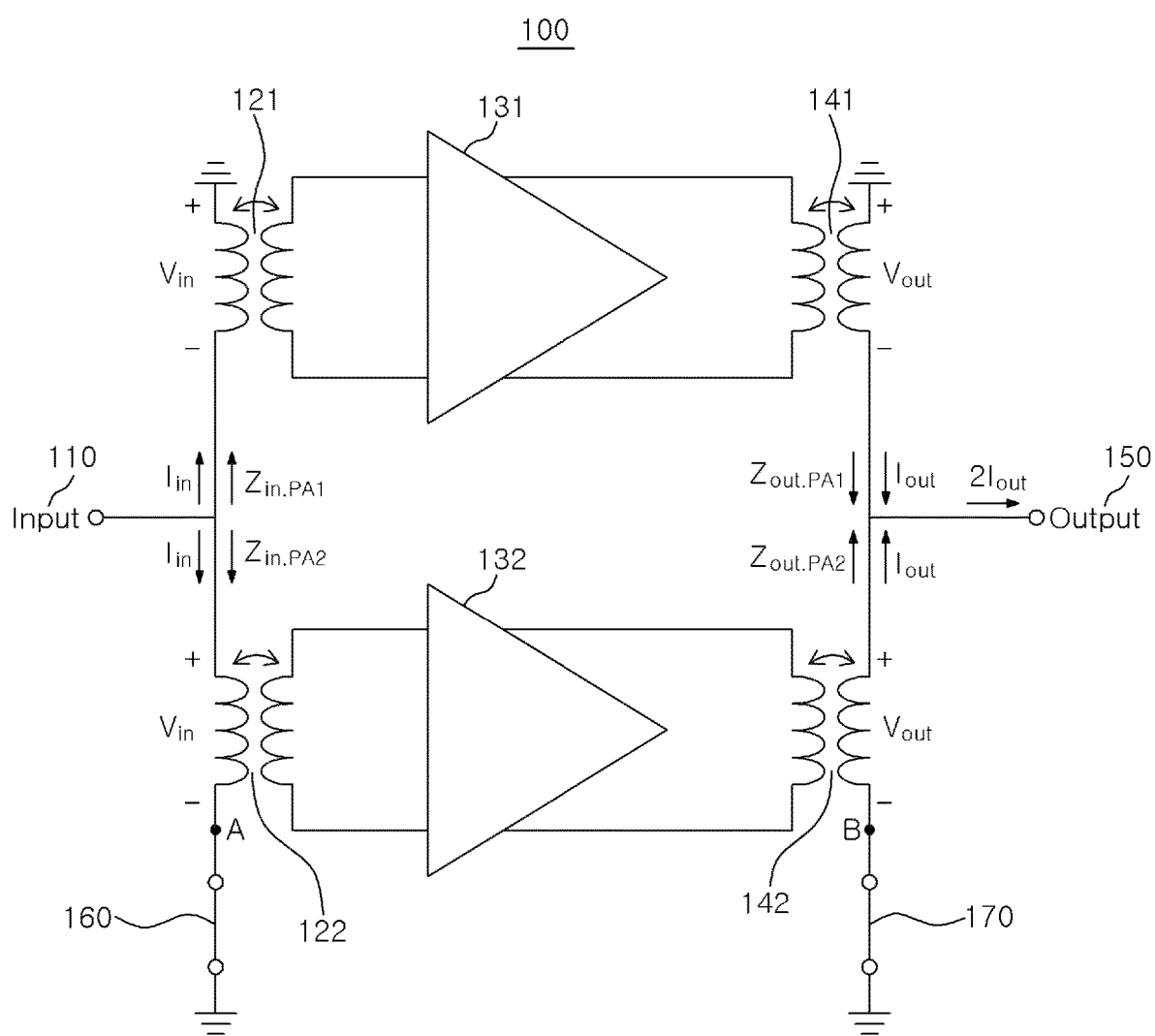
FIGS. 2 and 3 are circuit diagrams illustrating an operation of a power amplification apparatus according to a first embodiment.
Figure 3:
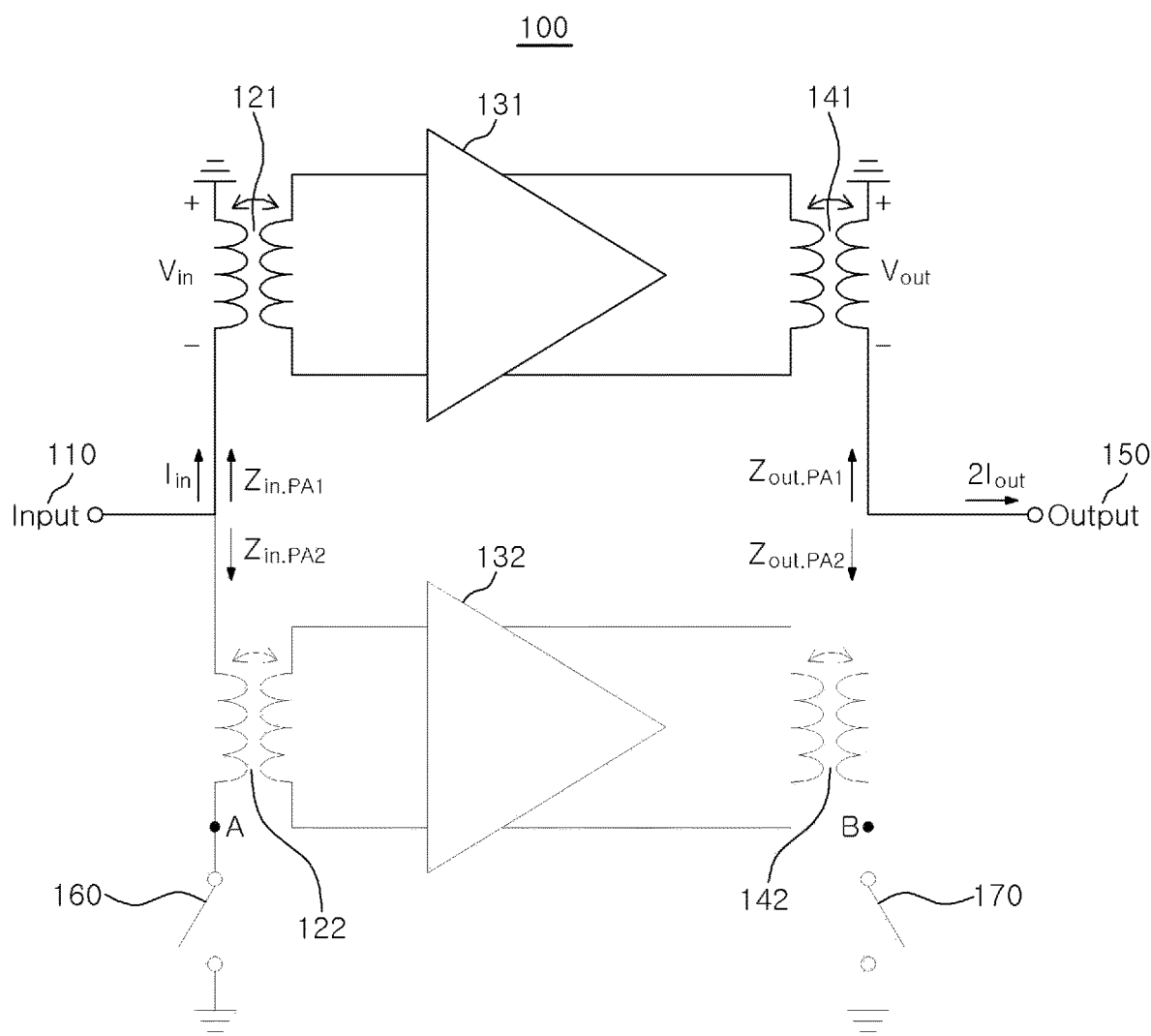
Figure 4:
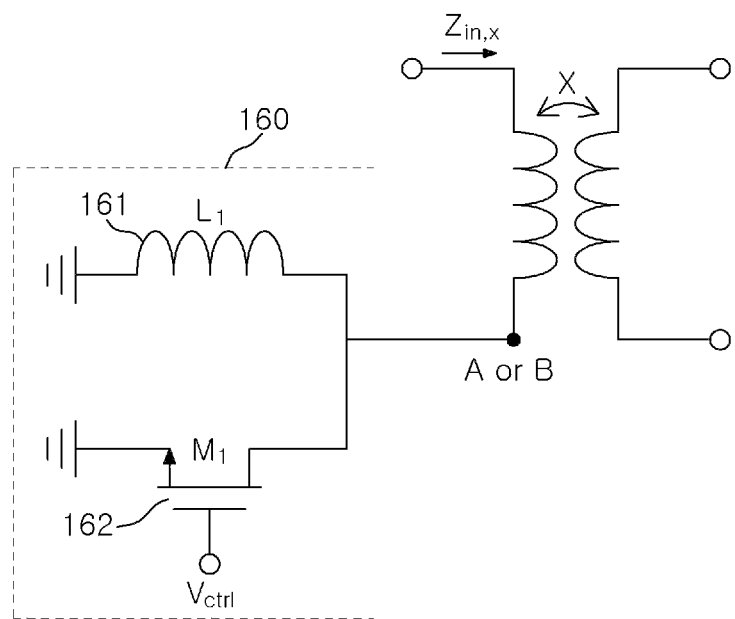
FIG. 4 is a circuit diagram illustrating a switch of a power amplification apparatus according to another embodiment of a first embodiment.

FIG. 1 is a circuit diagram illustrating a power amplification apparatus according to a first embodiment, and FIGS. 2 and 3 are circuit diagrams illustrating an operation of a power amplification apparatus according to a first embodiment. FIG. 4 is a circuit diagram illustrating a switch of a power amplification apparatus according to another embodiment of a first embodiment.

Referring to FIG. 1, a power amplification apparatus 100 according to a first embodiment may include an input part 110, a plurality of first transformers 121 and 122 connected to the input part 110 in parallel, a plurality of amplifiers 131 and 132 connected to the respective plurality of first transformers 121 and 122, a first switch 160 connected to either one of the plurality of first transformers 121 and 122, a plurality of second transformers 141 and 142 connected to the respective plurality of amplifiers 131 and 132 and connected to an output part 150 in parallel and a second switch 170 connected to either one of the plurality of second transformers 141 and 142.

The input part 110 may generate an RF signal. The input part 110 may receive signals from base stations and/or other transmitter stations, but not limited thereto.

The first transformers 121 and 122 may include a first-1 transformer 121 and a first-2 transformer 122. The first-1 transformer 121 may be connected to an output of the input part 110. The first-2 transformer 122 may be connected to the output of the input part 110 and connected to the first-1 transformer in parallel. The first-1 transformer 121 and the first-2 transformer 122 play the role of dividing an RF signal.

The first switch 160 may be connected to one side of the first-2 transformer 122. Depending on close or open operation of the first switch 160, an operation of the first-2 transformer 122 may be determined. The first switch 160 may include an active device. The first switch 160 may include a transistor or a diode, but not limited thereto.

The second transformers 141 and 142 may include a second-1 transformer 141 and a second-2 transformer 142. The second-1 transformer 141 may be connected to an output of the first amplifier 131. An output of the second-1 transformer 141 may be connected to the output part 150. The second-2 transformer 142 may be connected to an output of the second amplifier 132. The output of the second-2 transformer 142 may be connected to the output part 150. The second-2 transformer 142 may be connected to the second-1 transformer 141 in parallel.

The second switch 170 may be connected to one side of the second-2 transformer 142. Depending on close or open operation of the second switch 170, an operation of the second-2 transformer 142 may be determined. The second switch 170 may include an active device. The second switch 170 may include a transistor or a diode, but not limited thereto.

Hereinafter, it is described the case that the power amplification apparatus according to the first embodiment operates in high power mode and the case that the power amplification apparatus operates in low power mode. Here, FIG. 2 shows the feature that the power amplification apparatus according to the first embodiment operates in high power mode, and FIG. 3 shows the feature that the power amplification apparatus operates in low power mode.

As shown in FIG. 2, in the case that the power amplification apparatus operates in high power mode, the first switch 160 and the second switch 170 are closed. Accordingly, the first amplifier 131 and the second amplifier 132 may be turned on.

Since the first switch 160 is closed toward the ground, the current Iin according to an input signal is transferred to the primary side of the first-1 transformer 121 and the primary side of the first-2 transformer 122 and generates a voltage drop Vin. Here, the input current may be divided in half and transferred to the first-1 transformer 121 and the first-2 transformer 122.

The voltage generated at the primary side of the first-1 transformer 121 is transferred to the secondary side of the first-1 transformer 121 through coupling, and the voltage generated at the secondary side of the first-1 transformer 121 is transferred to the first amplifier 131. The voltage generated at the primary side of the first-2 transformer 122 is transferred to the second amplifier 132 through the secondary side of the first-2 transformer 122.

The output of the first amplifier 131 may be transferred to the primary side of the second-1 transformer 141. The voltage generated at the primary side of the second-1 transformer 141 is transferred to the secondary side of the second-1 transformer 141 through coupling. This generates a voltage drop Vout at the secondary side of the second-1 transformer 141.

The output of the second amplifier 132 may be transferred to the primary side of the second-2 transformer 142. The voltage generated at the primary side of the second-2 transformer 142 is transferred to the secondary side of the second-2 transformer 142. This generates a voltage drop Vout at the secondary side of the second-2 transformer 142.

The summation of current 2Iout generated in the second-1 transformer 141 and the second-2 transformer 142 may be transferred to the output part 150.

As shown in FIG. 3, in the case that the power amplification apparatus operates in low power mode, the first switch 160 and the second switch 170 are open. Accordingly, the first amplifier 131 may be turned on, and the second amplifier 132 may be turned off.

Since the first switch 160 is open, the impedance $Z_{in,PA2}$ viewed from the input part 110 to the second amplifier 132 may have infinite impedance as it is open. Accordingly, the current Iin generated by an input signal may be transferred only to the primary side of the first-1 transformer 121 and generate a voltage drop Vin.

Since a voltage drop is not present at the primary side of the first-2 transformer 122, a signal coupled to the secondary side of the first-2 transformer 122 is not present, and a signal may be transferred to the first amplifier 131 only through the coupling of the first-1 transformer 121. In this case, a DC bias is not applied to the second amplifier 132 to minimize DC current consumption.

Since the second switch 170 is open, the impedance $Z_{in,PA2}$ has a value same as it is open, and the current Iout outputs from the secondary side of the second-1 transformer 141 may be transferred to the output part 150 entirely, not transferred to the secondary side of the second-2 transformer 142.

In embodiments, the signal transferred to the first amplifier 131 is amplified by the first amplifier 131 and transferred to the primary side of the second-1 transformer 141, and transferred to the secondary side of the second-1 transformer 141 through coupling and outputs a final output to the output part 150.

Meanwhile, as shown in FIG. 2, when the power amplification apparatus 100 of dual output mode operates in high power mode, the power amplification apparatus 100 operates as A and B points are grounded, and a signal may be transferred to the first amplifier 131 and the second amplifier 132 without a voltage drop by a switch.

Furthermore, as shown in FIG. 3, when the power amplification apparatus 100 of dual output mode operates in low power mode, only in the case that the impedances $Z_{in,PA2}$, $Z_{out,PA2}$ viewed from the input and the output to the second amplifier 132 have infinite value, a loss is not occurred by the power leaked to the second amplifier 132.

Therefore, when the switch is on state, the power amplification apparatus 100 has very row resistance, or when the switch is off state, the impedances $Z_{in,PA2}$, $Z_{out,PA2}$ viewed from the input of an impedance transformer need to have infinite impedance.

However, since the switch is implemented using an active device, it is hard to satisfy both two conditions above.

A performance of a switch is greatly influenced by on-resistance of an active device, and the performance of the switch increases as the on-resistance is decreased. Since the on-resistance has an inverse proportional relation with a size of the active device, in the case of increasing the size of the active device to reduce the on-resistance, a parasitic component of the active device is also increased. Therefore, when the active device operates in off-state, a proper operation of the switch may not be expected in a high frequency band.

In the case that an ideal transformer is used, when one port is open among primary sides of the transformer (switch is turned off), the impedances $Z_{in,PA2}$, $Z_{out,PA2}$ viewed from an input port to the transformer may have infinite impedance without regard to a frequency. However, a parasitic capacitance is present in a real transformer, and accordingly, in a high frequency band, a capacitance impedance is sensed, not the infinite impedance.

Accordingly, an embodiment of the present disclosure proposes a switch structure of another embodiment to solve it. Here, structures of the first switch and the second switch are the same, and the structure of the first switch is described as an example.

As shown in FIG. 4, the first switch 160 may include an inductor 161 and a MOSFET transistor (hereinafter, referred to as 'M transistor' 162). The inductor 161 and the M transistor 162 may be connected in parallel. A control voltage Vctrl may be applied to the M transistor 162 for switching open and close state of ae switch.

In the case that the first switch 160 is closed, the control voltage Vctrl of the M transistor 162 may exert a high voltage to turn on the M transistor 162. In this case, a great size of the M transistor 162 may be used to have very low resistance. Accordingly, A (or B) point may be treated as the ground.

Since A (or B) point operates like the ground, the inductor 161 does not influence on the entire circuit.

When the structures of the first switch 160 and the second switch 170 according to the embodiment are applied to FIG. 2, the impedance $Z_{in,PA1}$, viewed from the input part 110 to the first amplifier 131 and the impedance $Z_{out,PA2}$ viewed from the input part 110 to the second transformer 132 are the same in the on state of the first switch 160 and the second switch 170. Accordingly, in the high power mode, signals of the same size may be transferred to the first amplifier 131 and the second transformer 132.

Furthermore, in the case that the first switch 160 is turned open, the control voltage Vctrl of the M transistor 162 may exert a low voltage to turn off the M transistor 162. In this case, the M transistor 162 may be treated as a capacitor by the parasitic capacitance.

In the case that A or B point is open, the transformer may operate with a capacitive impedance by a parasitic capacitance of the transformer. The capacitance by the M transistor 162 and the capacitance of the transformer may be resonant with a parallel inductor and may convert the input impedance $Z_{in,X}$ of the transformer as being infinite.

When the structures of the first switch and the second switch according to the embodiment are applied to FIG. 3, in the case that the first switch 160 and the second switch 170 are turned open, the impedance $Z_{out,PA2}$ viewed by the second amplifier 132 has infinite impedance for all cases, and all of the input signals are transferred to the first amplifier 131 only.

Since the second switch is open, the impedance $Z_{out,PA2}$ toward the second-2 transformer 142 is switched to have infinite impedance. In this case, the current Iout passing through the first amplifier 131 and the second-1 transformer 141 is not flowed to the second amplifier 132 but entirely transferred to the output part 150, and there is no loss of signals.

By using the switch structure according to the embodiment, the power amplification apparatus of dual output mode may be designed even in a high frequency band, and there is an effect that a design of the power amplification apparatus of dual output mode is available by using on/off state of a transformer only, not using an inductor in a low frequency band.

Figure 5:
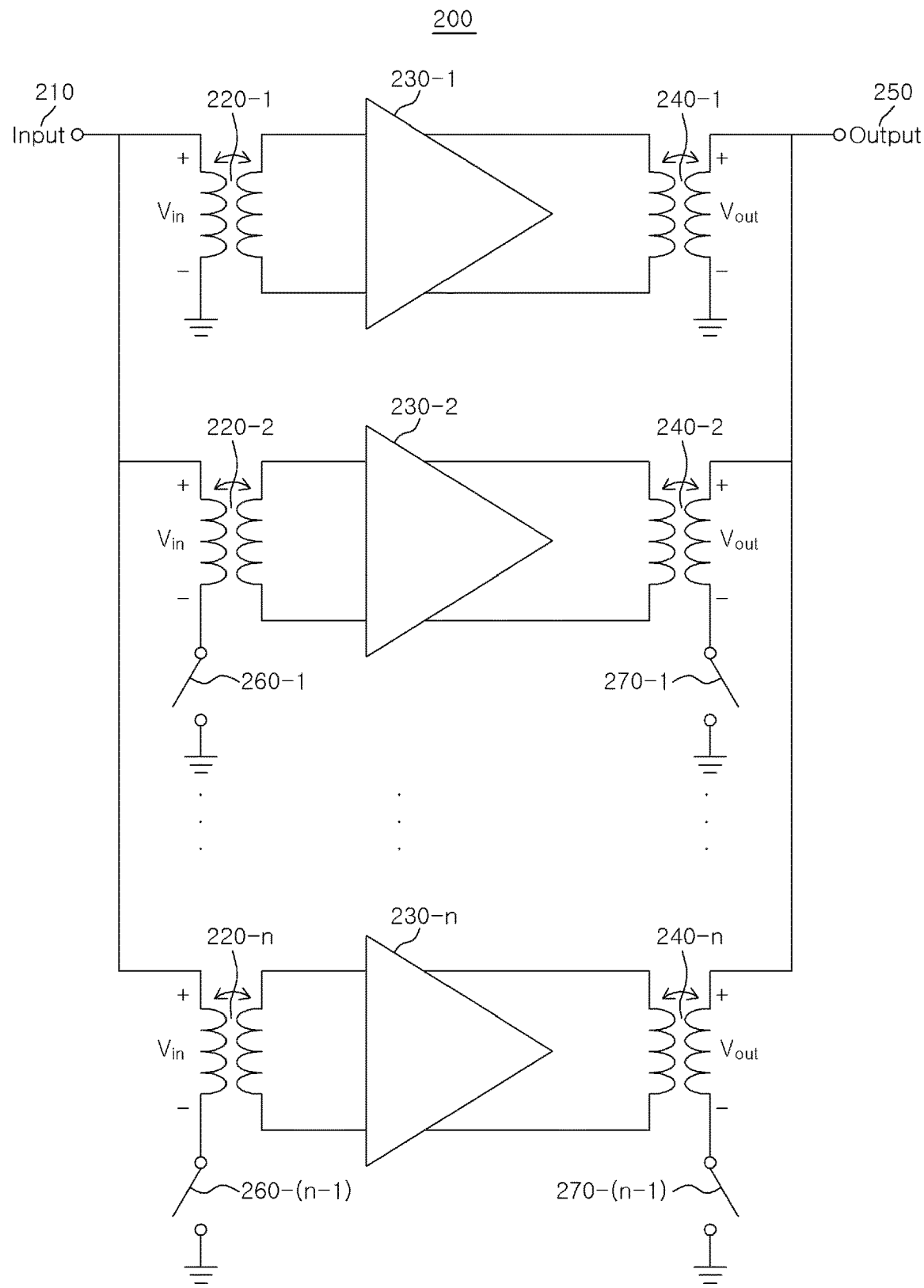
FIG. 5 is a circuit diagram illustrating a power amplification apparatus according to a second embodiment.

FIG. 5 is a circuit diagram illustrating a power amplification apparatus according to a second embodiment.

Referring to FIG. 5, a power amplification apparatus 200 according to a second embodiment may include an input part 210, a plurality of first transformers 220 connected to the input part 210 in parallel, a plurality of amplifiers 230 connected to the respective plurality of first transformers 220, a plurality of second transformers 240 connected to the respective plurality of amplifiers 230, a plurality of first switches 260 connected to one side of the first transformer 220 and a second switch 270 connected to one side of the second transformer 240.

The input part 210 may generate an RF signal. The input part 210 may receive signals from base stations and/or other transmitter stations, but not limited thereto.

The first transformer 220 may be connected to the input part 210 in parallel and may include a first-1 transformer 220-1 to a first-n transformer 220-n.

The amplifier 230 may include a first amplifier 230-1 to an $n^{th}$ amplifier 230-n. The first amplifier 230-1 to $n^{th}$ amplifier 230-n may be connected to the first-1 transformer 220-1 to the first-n transformer 220-n, respectively.

The first switch 260 may include a first-1 switch 260-1 to a first-(n−1) switch 260-(n−1). The first-1 switch 260-1 to first-(n−1) switch 260-(n−1) may be connected to one side of the first-2 transformer 220-2 to the first-n transformer 220-n. The first-1 switch 260-1 may be connected to one side of the first-2 transformer 220-2, and the first-(n−1) switch 260-(n−1) may be connected to one side of the first-n transformer 220-n.

The second transformer 240 may include a second-1 transformer 240-1 to a second-n transformer 240-n. The second-1 transformer 240-1 to second-n transformer 240-n may be connected to the first amplifier 230-1 to the $n^{th}$ transformer 230-n, respectively. The second-1 transformer 240-1 to second-n transformer 240-n may be connected to the output part 250 in parallel.

The second switch 270 may include a second-1 switch 270-1 to a second-(n−1) switch 270-(n−1). The second-1 switch 270-1 to second-(n−1) switch 270-(n−1) may be connected to one side of the second-2 transformer 240-2 to the second-n transformer 240-n.

There is an effect that the power amplification apparatus 200 according to the second embodiment may be used as a power amplification apparatus of multiple output mode of 2 or more. The structures of switches 260 and 270 may adopt the structures of FIG. 4.

Figure 6:
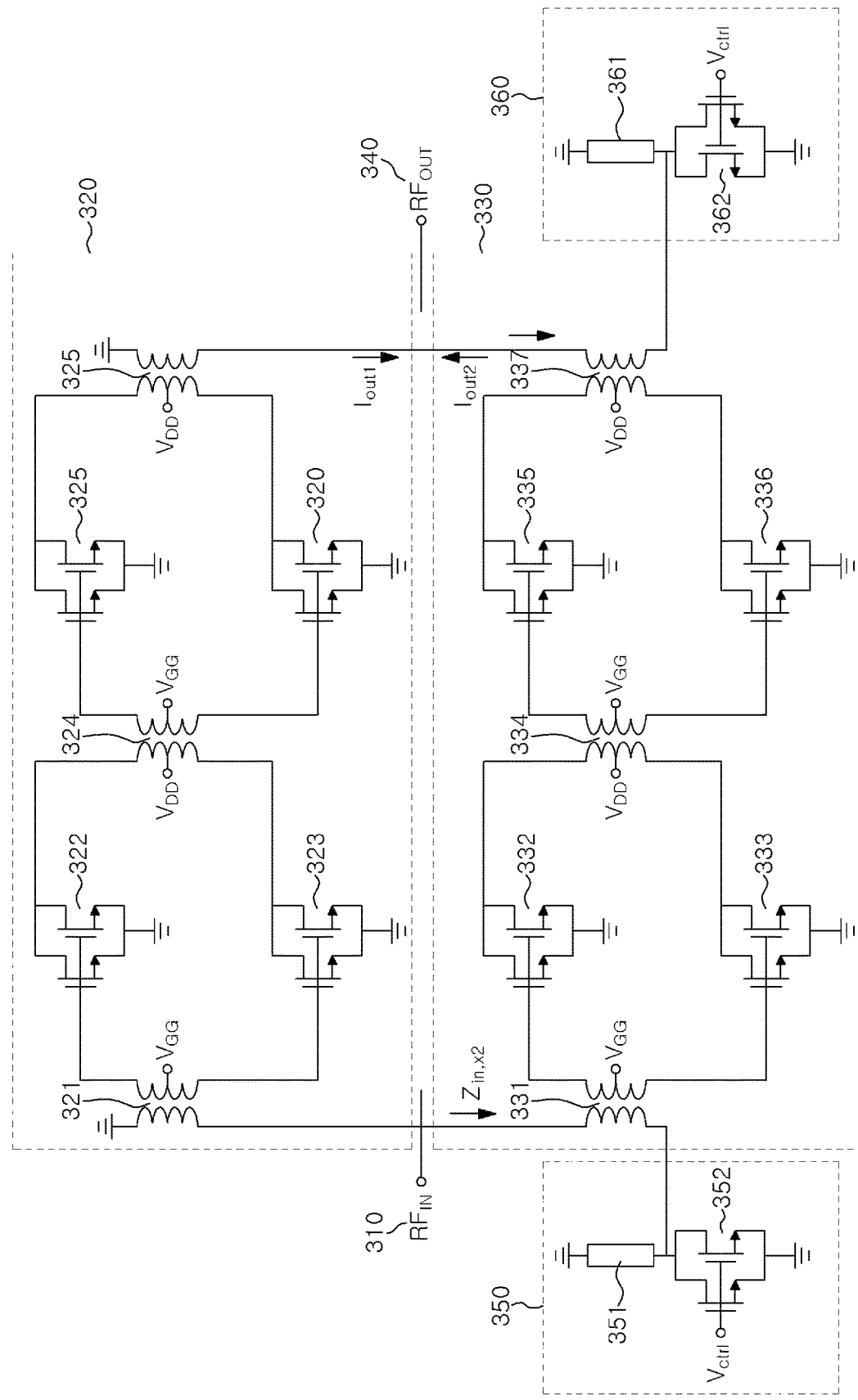
FIG. 6 is a circuit diagram illustrating a power amplification apparatus according to a third embodiment.

FIG. 6 is a circuit diagram illustrating a power amplification apparatus according to a third embodiment.

Referring to FIG. 6, a power amplification apparatus 300 according to a third embodiment may include an input part 310, a first amplifier 320 and a second amplifier 330 connected to the input part 310 in parallel, a first switch 350 connected to an input of the second amplifier 330 and a second switch 360 connected to an output of the second amplifier 330.

The input part 310 may generate an RF signal. The input part 310 may receive signals from base stations and/or other transmitter stations, but not limited thereto.

The first amplifier 320 may include a first-1 transformer 321, a first-1 transistor 322 and a first-2 transistor 323 connected to the first-1 transformer 321 in parallel, a first-3 transformer 324 commonly connected to the first-1 transistor 322 and the first-2 transistor 323, a first-3 transistor 325 and a first-4 transistor 326 connected to an output of the first-3 transformer 324 in parallel and a first-2 transformer 327 commonly connected to the first-3 transistor 325 and the first-4 transistor 326.

The second amplifier 330 may include a second-1 transformer 331, a second-1 transistor 332 and a second-2 transistor 333 connected to the second-1 transformer 331 in parallel, a second-3 transformer 334 commonly connected to the second-1 transistor 332 and the second-2 transistor 333, a second-3 transistor 335 and a second-4 transistor 336 connected to an output of the second-3 transformer 334 in parallel and a second-2 transformer 337 commonly connected to the second-3 transistor 335 and the second-4 transistor 336.

The first switch 350 and the second switch 360 may be active devices. Different from this, the first switch 350 and the second switch 360 may include transmission lines 351 and 361 operating as an inductor and M transistors 352 and 362 to which a control voltage is exerted.

The power amplification apparatus 300 according to the third embodiment may be designed using 65 nm CMOS manufacturing process. The power amplification apparatus 300 may be designed with a target frequency of 28 GHz band. In order to increase an output power performance, the transformer is connected in parallel, and in order to increase a gain, the circuit is implemented in second stage.

An operation of the power amplification apparatus 300 in high power mode is described below.

A control bias Vctrl applied to the M transistor is increased, and the first switch 350 and the second switch 360 may be turned on.

Since the first switch 350 is closed, a part connected to the first switch 350 among the primary sides of the second-1 transformer 331 operates as being connected to the ground. Accordingly, in the case that an input signal RFin is applied, a current and a voltage drop may be generated in the first-1 transformer 321 and the second-1 transformer 331.

The current flowed to the primary side of the first-1 transformer 321 and the second-1 transformer 331 generates a current and a voltage in the secondary sides of the first-1 transformer 321 and the second-1 transformer 331, and after the generated voltage is applied to the gates of the first-1 transistor 322 and the first-2 transistor 323, and the second-1 transistor 332 and the second-2 transistor 333, and amplified, and then, transfers a current to the primary side of the first-3 transformer 324 and the second-3 transformer 334 and causes a voltage drop.

The current flowed to the primary side of the first-3 transformer 324 and the second-3 transformer 334 is transferred to the secondary sides of the first-3 transformer 324 and the second-3 transformer 334 and generates a voltage. After the generated voltage passes through the first-3 transistor 325 and the first-4 transistor 326, and second-3 transistor 335 and the second-4 transistor 336, and amplified, and then transfers a current to the primary side of the first-2 transformer 327 and the second-2 transformer 337 and causes a voltage drop.

Being coupled in the primary sides of the first-2 transformer 327 and the second-2 transformer 337, voltage drops, and currents are generated in the secondary sides of the first-2 transformer 327 and the second-2 transformer 337. The currents Iout1 and Iout2 generated in the secondary sides of the first-2 transformer 327 and the second-2 transformer 337 are joined and transferred to the output part (RFout) 340.

An operation of the power amplification apparatus 300 in low power mode is described below.

A control bias Vctrl applied to the M transistor is decreased, and the first switch 350 and the second switch 360 may be open.

Since the first switch 350 is open, and the impedance $Z_{in,x}2$ toward the second-1 transformer 331 has an infinite value, an input signal RFin is applied only to the primary side of the first-1 transformer 321 and a current and a voltage drop may be generated.

The current flowed to the primary side of the first-1 transformer 321 generates a current and a voltage in the secondary side of the first-1 transformer 321, after the generated voltage is applied to the gates of the first-1 transistor 322 and the first-2 transistor 323, and amplified, and then, transfers a current to the primary side of the first-3 transformer 324 and causes a voltage drop.

The current flowed to the primary side of the first-3 transformer 324 generates a current and a voltage in the secondary side of the first-3 transformer 324, and the voltage passes through the first-3 transistor 325 and the first-4 transistor 326 and is amplified. Thereafter, the current is transferred to the primary side of the first-2 transformer 327 and causes a voltage drop. The primary side of the first-2 transformer 327 is coupled with the secondary sides of the first-2 transformer 327, and voltage drop, and current are generated in the secondary sides of the first-2 transformer 327.

Since the second switch 360 is open, the impedance $Z_{in,x6}$ toward the second-2 transformer 337 has an infinite value, and accordingly, the current Iout1 generated in the secondary sides of the first-2 transformer 327 is transferred to the output part 340.

Figure 7:
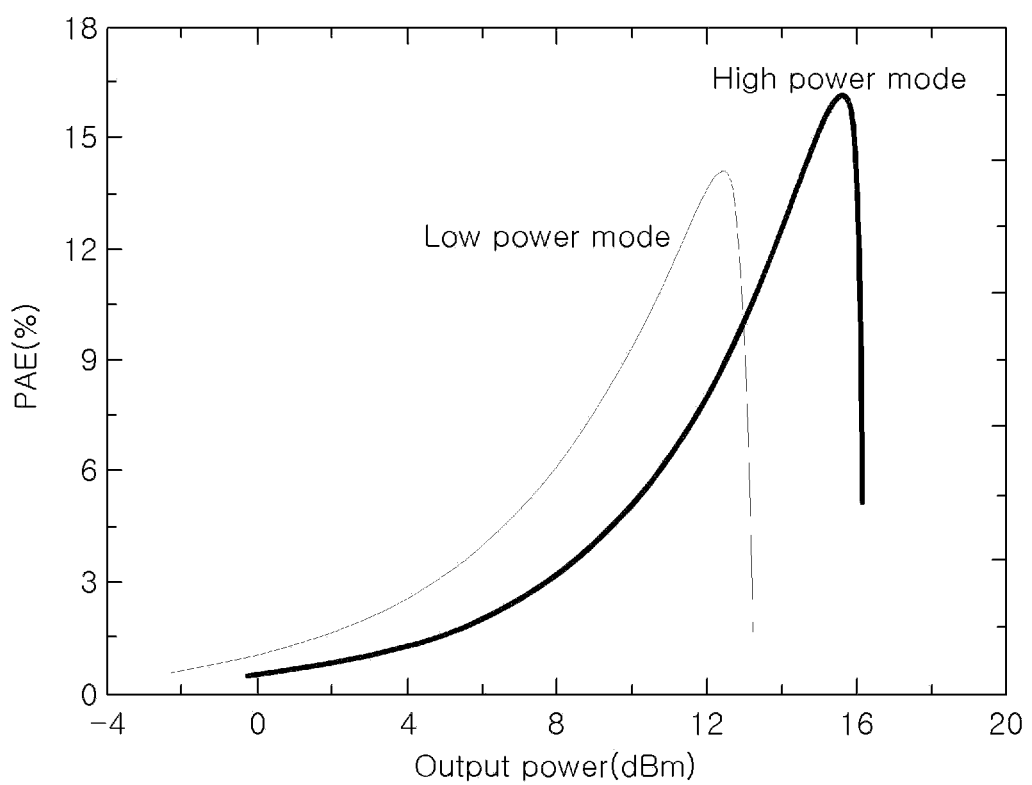
FIG. 7 is a graph illustrating a result of experimenting in low power mode and high power mode of a power amplification apparatus according to an embodiment.

FIG. 7 is a graph illustrating a result of experimenting in low power mode and high power mode of a power amplification apparatus according to an embodiment.

As shown in FIG. 7, in the low power mode, an efficiency of 12 to 15% is shown, and in the high power mode, an efficiency of 15 to 18% is shown. It is identified that an efficiency of 20% or more may be improved in comparison with the related art, and particularly, the improvement is greater in the output efficiency in the low power mode.

The embodiment of the present disclosure designs a power amplifier for which multiple output mode is available, and there is an effect of having high efficiency.

In addition, a distance between a transmitter and a receiver is changed in real time for a mobile communication, and the embodiment of the present disclosure has an effect of reducing DC power consumption by using a high power mode in a long distance and a low power mode in a short distance.

In addition, the embodiment of the present disclosure designs to switch an output mode depending on a modulation scheme and minimizes DC power consumption.

In addition, the embodiment of the present disclosure designs a power amplifier using one type of power amplifier, and there is an effect that a circuit area may be reduced efficiently.

In addition, the embodiment of the present disclosure uses an inductor and a transistor as a switch, and there is an effect that switching loss is reduced.

In addition, the embodiment of the present disclosure designs uses a lossless switch, and there is an effect that the number of power amplifier may be increased without restriction.

As described above, those skilled in the art will understand that the present disclosure can be implemented in other forms without changing the technical idea or essential features thereof. Therefore, it should be understood that the above-described embodiments are merely examples, and are not intended to limit the present disclosure. The scope of the present disclosure is defined by the accompanying claims rather than the detailed description, and the meaning and scope of the claims and all changes and modifications derived from the equivalents thereof should be interpreted as being included in the scope of the present disclosure.

What is claimed is:

1. A power amplification apparatus, the apparatus comprising:
    an input part;
    a first-1 transformer and a first-2 transformer connected to the input part in parallel;
    a first amplifier and a second amplifier connected to the first-1 transformer and the first-2 transformer, respectively;

a first switch connected to one side of the first-2 transformer;

a second-1 transformer and a second-2 transformer connected to the first amplifier and the second amplifier, respectively, and connected to an output part in parallel; and a second switch connected to one side of the second-2 transformer.

2. The power amplification apparatus of claim 1, wherein the first switch and the second switch are closed or opened simultaneously.

3. The power amplification apparatus of claim 1, when the first switch and the second switch are closed, wherein an input signal is transferred to the first amplifier and the second amplifier and amplified.

4. The power amplification apparatus of claim 1, when the first switch and the second switch are open, wherein an input signal is transferred to the first amplifier and amplified.

5. The power amplification apparatus of claim 1, wherein the first switch and the second switch include a transistor or a diode.

6. The power amplification apparatus of claim 1, wherein the first switch includes an inductor and a MOSFET transistor to which a control voltage is applied.

* * * * *